United States Patent
Tu et al.

(10) Patent No.: US 11,019,439 B2
(45) Date of Patent: May 25, 2021

(54) ADJUSTING SYSTEM AND ADJUSTING METHOD FOR EQUALIZATION PROCESSING

(71) Applicant: Acer Incorporated, New Taipei (TW)

(72) Inventors: Po-Jen Tu, New Taipei (TW); Jia-Ren Chang, New Taipei (TW); Kai-Meng Tzeng, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 16/698,889

(22) Filed: Nov. 27, 2019

(65) Prior Publication Data

US 2021/0092539 A1    Mar. 25, 2021

(30) Foreign Application Priority Data

Sep. 19, 2019 (TW) ................................ 108133765

(51) Int. Cl.
| | | |
|---|---|---|
| *H04R 29/00* | (2006.01) | |
| *G01R 23/163* | (2006.01) | |
| *H04R 3/04* | (2006.01) | |
| *H03G 7/00* | (2006.01) | |

(52) U.S. Cl.
CPC ......... *H04R 29/001* (2013.01); *G01R 23/163* (2013.01); *H04R 3/04* (2013.01); *H03G 7/002* (2013.01)

(58) Field of Classification Search
CPC ... H04R 3/14; H04R 3/12; H04R 3/04; H04R 29/001; H03G 7/002; H03G 5/025; H03G 5/165; H03G 5/14; H03G 5/24; H03G 9/025

USPC ................................ 381/103, 58–59, 98–99
See application file for complete search history.

(56) References Cited

U.S. PATENT DOCUMENTS

| | | | | |
|---|---|---|---|---|
| 8,085,951 | B2* | 12/2011 | Trautmann | H04R 29/00 381/101 |
| 2002/0136414 | A1* | 9/2002 | Jordan | H04S 3/00 381/58 |
| 2011/0038490 | A1* | 2/2011 | Yang | H03G 5/165 381/103 |
| 2018/0014121 | A1* | 1/2018 | Lawrence | G10L 21/0272 |

* cited by examiner

*Primary Examiner* — Disler Paul
(74) *Attorney, Agent, or Firm* — JCIPRNET

(57) ABSTRACT

An adjusting system and an adjusting method for equalization processing are provided. Frequency band energies of sound receiving signals are obtained. The frequency band energies correspond to different frequency bands, respectively. Target gains corresponding to frequency bands are determined according to the frequency band energies. Frequency responses of filtering processing with respect to a plurality of center frequencies are obtained. Equalization gains corresponding to the frequency bands and having the least gain error are determined. The gain error is related to a difference between the amplitude obtained after the equalization gains are reflected on the frequency responses corresponding to the filtering processing and the target gains. The equalization gains are inputted into the filtering processing according to the corresponding frequency bands. Accordingly, the impact of the filtering processing can be reduced.

15 Claims, 4 Drawing Sheets

ADJUSTING SYSTEM AND ADJUSTING METHOD FOR EQUALIZATION PROCESSING

CROSS-REFERENCE TO RELATED APPLICATION

This application claims the priority benefit of Taiwan application serial no. 108133765, filed on Sep. 19, 2019. The entirety of the above-mentioned patent application is hereby incorporated by reference herein and made a part of this specification.

BACKGROUND OF THE DISCLOSURE

Field of the Disclosure

The disclosure relates to sound signal processing, and more particularly, to an adjusting system and an adjusting method for equalization processing.

Description of Related Art

An equalization (EQ) technology of a sound signal mainly uses a filter to distinguish different frequency bands, and then defines a suitable target gain according to requirements of each frequency band. Based on different sensitivities of people to a sound frequency, a lower frequency change is more easily perceived by people. Please refer to FIG. 1, which is a schematic diagram of frequency band distinguishing. In the prior art, a ⅓ octave technology may be used to distinguish frequency bands. As center frequencies $f_c^0$ to $f_c^4$ increase, widths of corresponding frequency bands of the center frequencies $f_c^0$ to $f_c^4$ also increase (a middle portion of a trapezoidal frequency response as shown in the figure). However, since a delay time of signal processing is fixed, total sampling points of each filter are fixed, and a length of a transition frequency band is fixed (both sides of the trapezoidal frequency response as shown in the figure). For the center frequency of a high frequency (e.g., the center frequency $f_c^4$), the transition frequency band of the center frequency has a little impact. However, for the center frequency of a low frequency (e.g., the center frequency $f_c^0$), the transition frequency band has a great impact.

FIG. 2 is a flow diagram of conventional equalization adjustment. Referring to FIG. 2, a speaker first plays a sound signal of each center frequency, and a microphone receives a sound and then calculates energy (step S210). A difference between a frequency band energy and an ideal energy is determined as a target gain of each frequency band (step S230). In the prior art, a filter is regarded as an ideal state, and the target gain of each frequency band is directly inputted into the corresponding filter without considering the impact of a low-frequency transition frequency band (step S250). It is conceivable that a gain error of a low frequency band may be large. However, manufacturers usually improve by manual correction, which not only has a long correction time, but also easily causes misjudgment.

SUMMARY OF THE DISCLOSURE

In view of this, embodiments of the disclosure provide an adjusting system and an adjusting method for equalization processing, which self-obtain a suitable equalization gain, thereby improving the impact of filtering processing.

The adjusting system for equalization processing according to the embodiments of the disclosure includes a processing device. Corresponding target gains of a sound signal in a plurality of frequency bands are determined after the sound signal is filtered. The processing device loads and executes a plurality of modules. The modules include a target gain determining module, a frequency response determining module, an equalization gain determining module, and a filtering processing module. The target gain determining module obtains a plurality of frequency band energies of a plurality of sound receiving signals, and determines a plurality of target gains corresponding to the frequency bands according to the frequency band energies. The frequency band energies correspond to different frequency bands, respectively. The frequency response determining module obtains frequency responses of filtering processing with respect to a plurality of center frequencies. The equalization gain determining module determines a plurality of equalization gains corresponding to the frequency bands and having the least gain error. The filtering processing module inputs the equalization gains into the filtering processing according to the corresponding frequency bands. The gain error is related to a difference between the amplitude obtained after the equalization gains are reflected on the frequency responses corresponding to the filtering processing and the target gains.

The adjusting method for equalization processing according to the embodiments of the disclosure includes the following steps: obtaining a plurality of frequency band energies of a plurality of sound receiving signals, the frequency band energies corresponding to different frequency bands, respectively; determining a plurality of target gains corresponding to the frequency bands according to the frequency band energies; obtaining frequency responses of filtering processing with respect to a plurality of center frequencies; determining a plurality of equalization gains corresponding to the frequency bands and having the least gain error, where the gain error is related to a difference between the amplitude obtained after the equalization gains are reflected on the frequency responses corresponding to the filtering processing and the target gains; and then, inputting the equalization gains into the filtering processing according to the corresponding frequency bands.

Based on the above, the adjusting system and the adjusting method for equalization processing according to the embodiments of the disclosure find out equalization gains suitable for respective frequency bands, so that the amplitudes of the equalization gains after filtering processing are closest to a target gain (i.e., a gain error is minimized). Accordingly, the impact of transition frequency bands of the filtering processing can be reduced.

In order to make the aforementioned and other objectives and advantages of the disclosure comprehensible, embodiments accompanied with figures are described in detail below.

DESCRIPTION OF THE EMBODIMENTS

Figure 1:
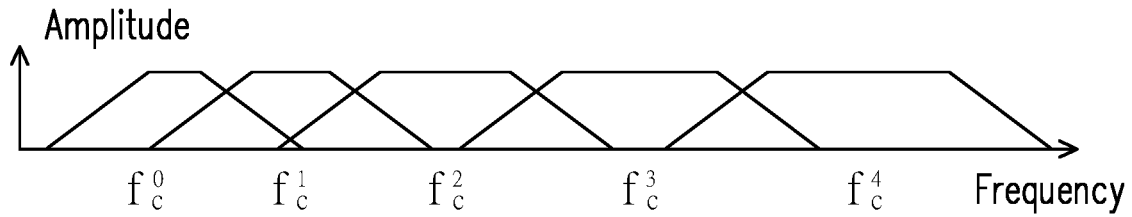
FIG. 1 is a schematic diagram of frequency band distinguishing.
Figure 2:
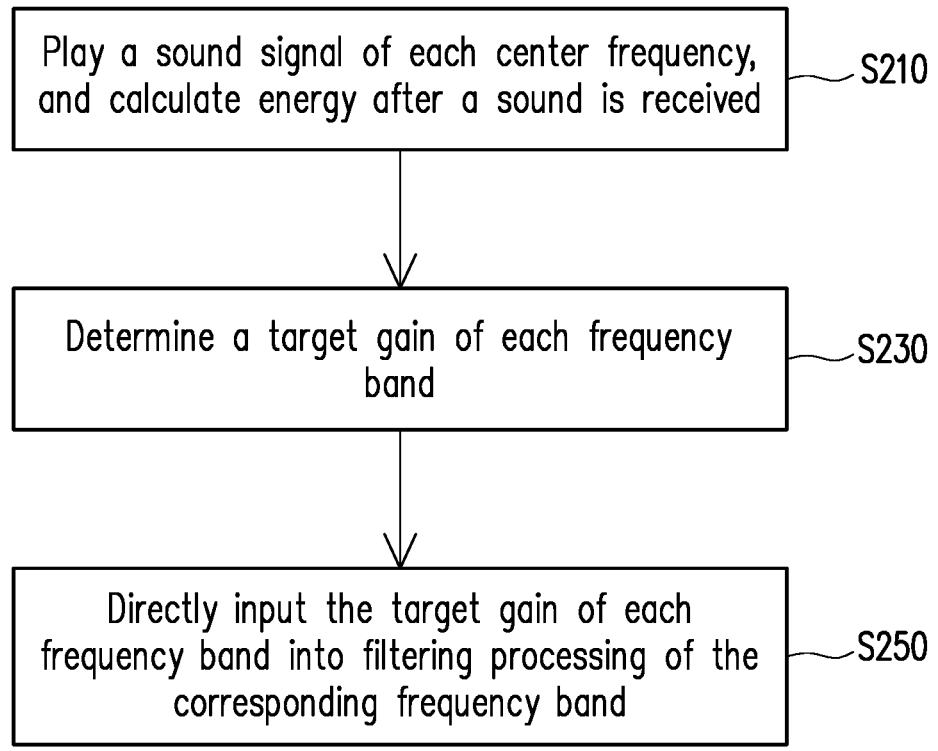
FIG. 2 is a flow diagram of conventional equalization adjustment.
Figure 3:
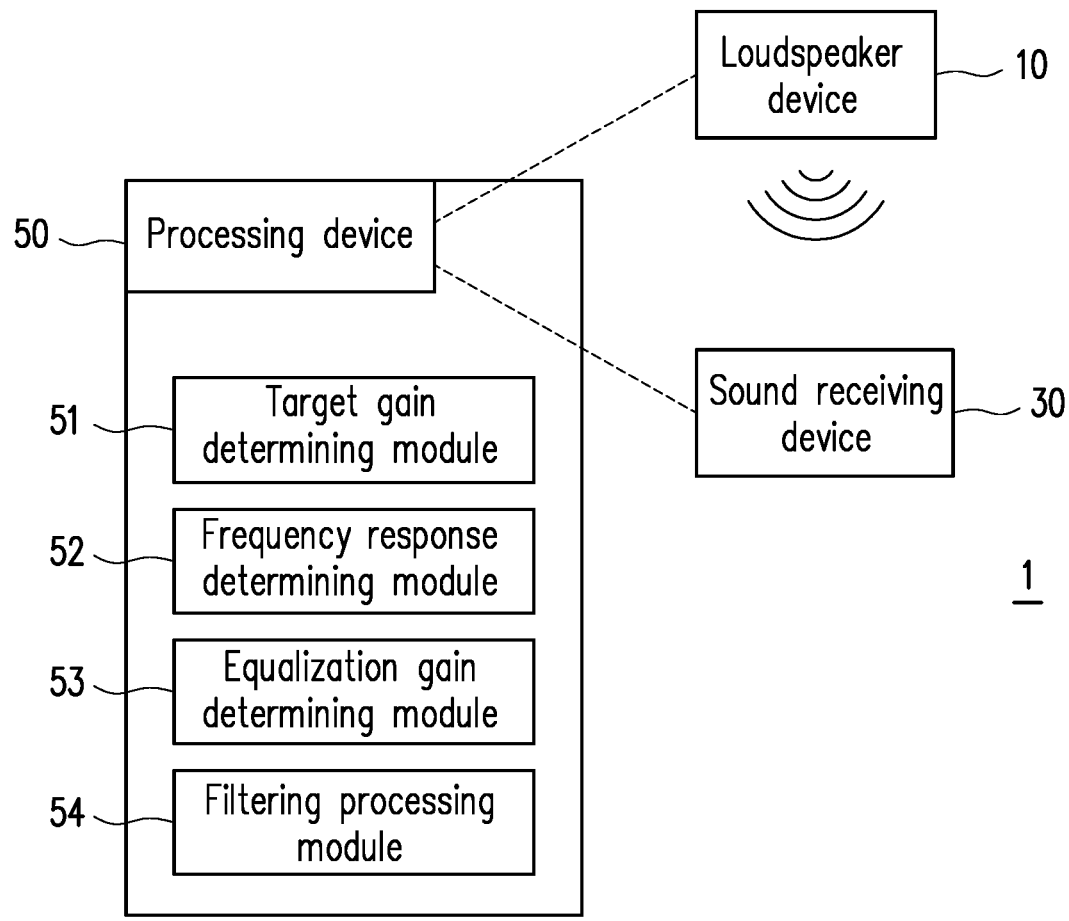
FIG. 3 is a device block diagram of an adjusting system for equalization processing according to an embodiment of the disclosure.

FIG. 3 is a device block diagram of an adjusting system 1 for equalization processing according to an embodiment of the disclosure. Referring to FIG. 3, the adjusting system 1 includes, but not limited to, a loudspeaker device 10, a sound receiving device 30 and a processing device 50.

The loudspeaker device 10 may be a sound playing device such as a speaker (loudspeaker) or a megaphone.

The sound receiving device 30 may be a microphone (e.g., a dynamic type, a condenser type and an electret condenser type) or other electronic devices that may receive a sound wave and convert the sound wave into a sound signal.

The processing device 50 may be a desktop computer, a notebook computer, a smart phone, a tablet computer, or a server. The processing device 50 includes at least a processor (e.g., a central processing unit (CPU), or other programmable general-purpose or special-purpose microprocessors, a digital signal processor (DSP), a field programmable gate array (FPGA), a programmable controller, an application-specific integrated circuit (ASIC) or other similar components or a combination of the above components), for performing all operations of the processing device 50. In the embodiment of the disclosure, the processing device 50 may load and execute software modules (stored in a memory). The software modules include a target gain determining module 51, a frequency response determining module 52, an equalization gain determining module 53, and a filtering processing module 54, and the detailed operations will be described in the following embodiments.

It is to be noted that the processing device 50 may be electrically connected to the loudspeaker device 10 and the sound receiving device 30. One or more of the devices 10, 30 and 50 may also be integrated into a single electronic device.

Figure 4:
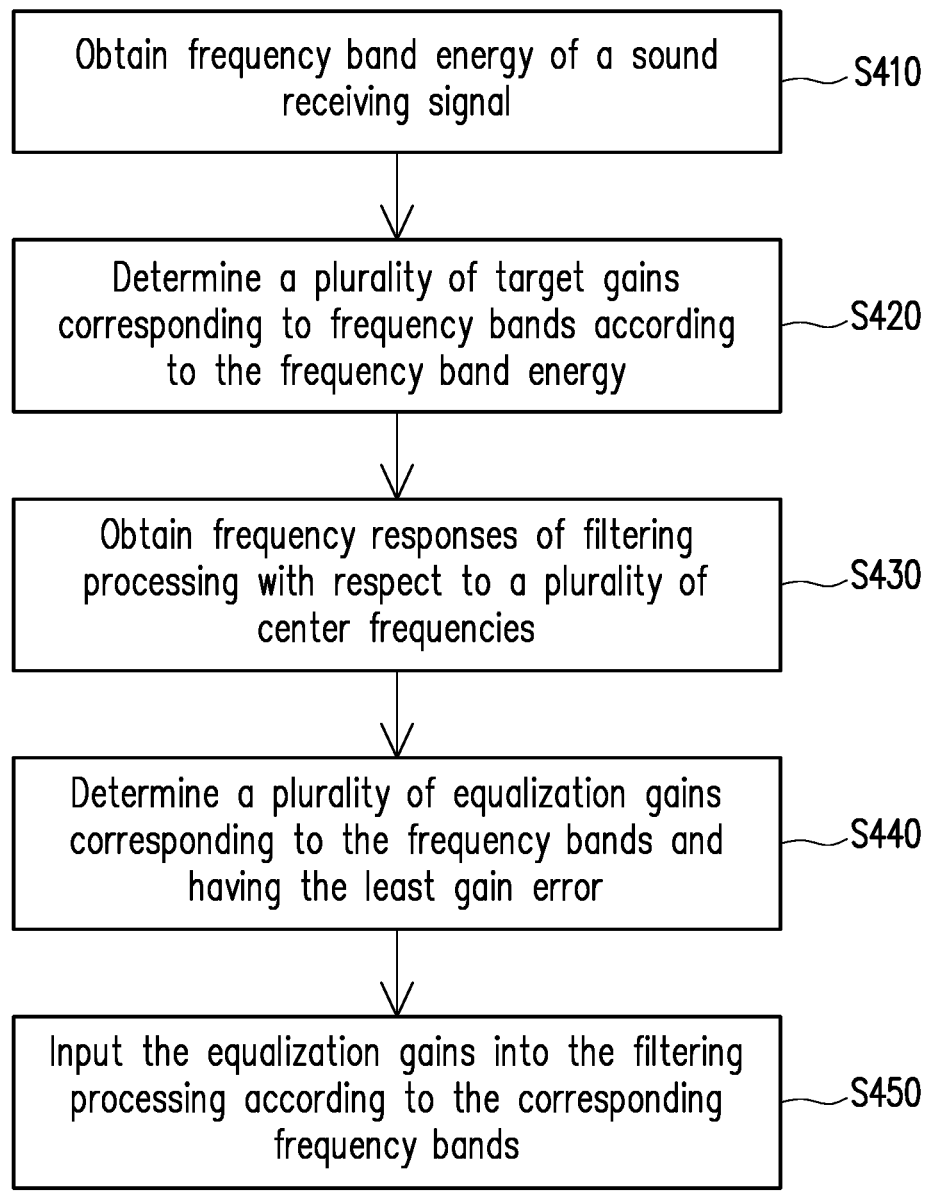
FIG. 4 is a flow diagram of an adjusting method for equalization processing according to an embodiment of the disclosure.

For convenience of understanding of an operation process of the embodiment of the disclosure, the operation process of the adjusting system 1 in the embodiment of the disclosure will be described in detail below with many embodiments. Hereinafter, the method described in the embodiment of the disclosure will be described in conjunction with each device in the adjusting system 1. The various processes of the method may be adjusted accordingly according to an implementation situation, and are not limited thereto. FIG. 4 is a flow diagram of an adjusting method for equalization processing according to an embodiment of the disclosure. Referring to FIG. 4, the filtering processing module 54 of the processing device 50 performs filtering processing on a sound receiving signal (e.g., via a filter), and may distinguish the sound receiving signal into different frequency bands (based on an octave technology, a ⅓ octave technology or the like). The target gain determining module 51 then obtains a plurality of frequency band energies obtained by receiving each training sound signal through the sound receiving device 30 (step S410). The frequency band energies correspond to different frequency bands (and also correspond to different center frequencies), respectively. The frequency band energy is energy calculated according to the amplitude on a certain frequency band distinguished by the filtering processing.

In an embodiment, the sound receiving signal may be obtained by respectively playing a plurality of training sound signals through the loudspeaker device 10, and the sound receiving device 30 receives a sound in response to the playing of each of the training sound signals. A center frequency corresponding to each of the training sound signals is different from center frequencies of the other training sound signals, and the center frequencies corresponding to the training sound signals correspond to different frequency bands, respectively. The loudspeaker device 10 may sequentially play the training sound signals corresponding to different center frequencies, and meanwhile, the sound receiving device 30 receives the sound to generate the sound receiving signal. In another embodiment, the target gain determining module 51 may obtain the sound receiving signals by ways including downloading or inputting data.

The target gain determining module 51 determines a plurality of target gains corresponding to the frequency bands according to the frequency band energies (step S420). A difference between the frequency band energy and an ideal energy is the target gain of each frequency band, and a value thereof may be predefined. In other embodiments, the target gain may also have a proportional relation or other mathematical representation relations with the corresponding frequency band energy.

The frequency response determining module 52 may obtain frequency responses of filtering processing with respect to a plurality of center frequencies (step S430). The frequency response of the filter corresponding to each center frequency may be obtained from the memory, or through table lookup, algorithm calculation or reference signal training and other ways. In the present embodiment, it is assumed that a plurality of frequency responses of the filter to each center frequency is represented by a matrix $\overline{C}$ as:

$$\begin{bmatrix} c_{00} & c_{01} & \cdots & c_{0N} \\ c_{10} & \ddots & & \vdots \\ \vdots & & \ddots & \vdots \\ c_{N0} & c_{N1} & \cdots & c_{NN} \end{bmatrix}, \quad (1)$$

$c_{00}$ to $c_{NN}$ are frequency responses corresponding to the $0^{th}$ center frequency to the $N^{th}$ center frequency, and N is a positive integer.

Then, the equalization gain determining module 53 determines a plurality of equalization gains corresponding to the frequency bands and having the least gain error (step S440). Specifically, one of the main objectives of the embodiments of the disclosure is to find an equalization gain (a vector thereof is $\overline{g}^{EQ}$ [$g_0^{QE}$ $g_1^{EQ}$ ... $g_N^{EQ}$], and it is assumed that there are the $0^{th}$ frequency band to the $N^{th}$ frequency band) suitable for each frequency band according to the characteristics of a passband and a transition frequency band in the aforementioned frequency responses, so that the amplitude of the determined equalization gain multiplied by the frequency response is closest to the target gain.

It is assumed that a vector of the target gain is $\overline{g}^T = [g_0^T \ g_1^T \ \ldots \ g_N^T]$, a mathematical relation between the equalization gain and the target gain is as follows:

$$\overline{g}^T = \|\overline{C} \cdot \overline{g}^{EQ}\| \quad (2)$$

$$\begin{bmatrix} g_0^T \\ g_1^T \\ \vdots \\ g_N^T \end{bmatrix} = \left\| \begin{bmatrix} c_{00} & c_{01} & \cdots & c_{0N} \\ c_{10} & \ddots & & \vdots \\ \vdots & & \ddots & \vdots \\ c_{N0} & c_{N1} & \cdots & c_{NN} \end{bmatrix} \cdot \begin{bmatrix} g_0^{EQ} \\ g_1^{EQ} \\ \vdots \\ g_N^{EQ} \end{bmatrix} \right\| \quad (3)$$

The equalization gain is an estimated value, so an initial value thereof is unknown. The equalization gain estimated by the embodiments of the disclosure minimizes the gain error. That is:

$$\min_{\overline{g}^{EQ}} \left\{ \sum_{n=0}^{N} \left[ \frac{g_n^T}{\overline{c}_n \cdot \overline{g}^{EQ}} - 1 \right] \right\}, \quad (4)$$

$\overline{c}_n$ is the $n^{th}$ column of $\overline{C}$ (n is a positive integer from 0 to N, which represents the $n^{th}$ frequency band or the $n^{th}$ center frequency), and $g_n^T$ is the target gain of the $n^{th}$ center frequency. The gain error is related to a difference $$\left( e.g., \sum_{n=0}^{N} \left[ \frac{g_n^T}{\overline{c}_n \cdot \overline{g}^{EQ}} - 1 \right] \right)$$

between the amplitude obtained after the equalization gains corresponding to the respective frequency bands are reflected on the frequency responses (e.g., the mathematical expression (1)) corresponding to the filtering processing (or processing via the filter) and the target gains determined in step 430.

Ideally, after the equalization gain $\overline{g}^{EQ}$ of each frequency band is multiplied by a filter frequency response matrix $\overline{C}$ of the corresponding frequency band, the amplitude thereof is the target gain $\overline{g}^T$. It seems that the equalization gain $\overline{g}^{EQ} = \overline{C}^{-1} \cdot \overline{g}^T$ may be obtained by an inverse matrix. However, since the frequency response matrix $\overline{C}$ is a complex number instead of a real number, the complexity of direct calculation is quite high. There are many methods to minimize a calculation error. In order to find the EQ gain with the least error value more efficiently, in the embodiments of the disclosure, the target gain of each frequency band is first assumed to be:

$$g_n^T = \|\overline{c}_n \cdot \overline{g}^{EQ}\| \quad (5),$$

and then, the equalization gains of the respective frequency bands are sequentially calculated, and gradually approach the target gain. More notably, the calculation of the corresponding equalization gain starting from a low frequency with a large error will improve the accuracy.

Figure 5:
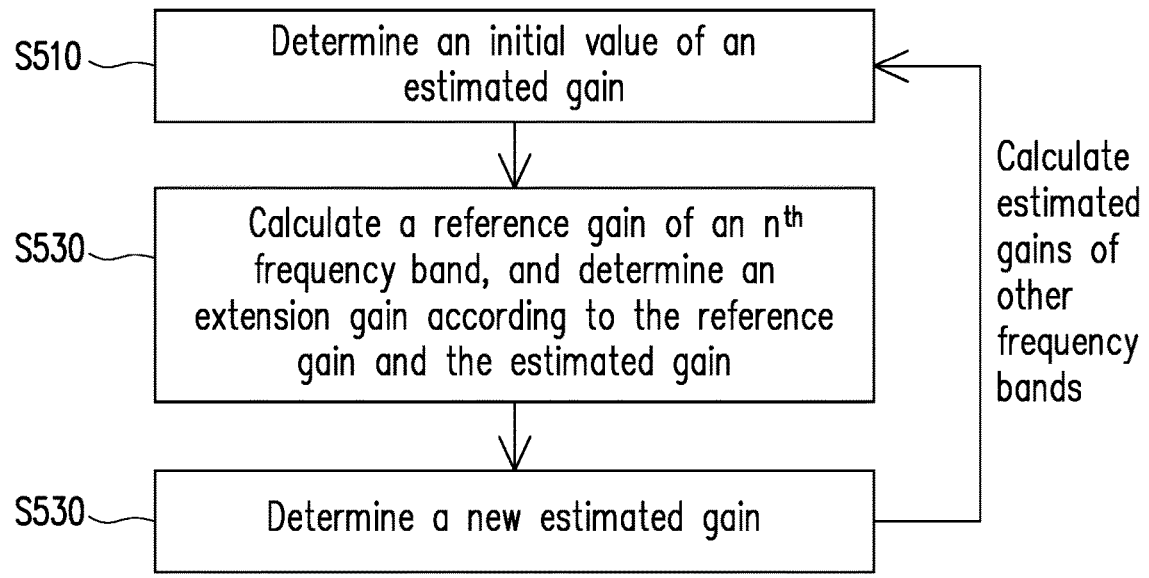
FIG. 5 is a flow diagram of calculation of an estimated gain according to an embodiment of the disclosure.

FIG. 5 is a flow diagram of calculation of an estimated gain according to an embodiment of the disclosure. Referring to FIG. 5, the equalization gain determining module 53 determines an initial value of an estimated gain of each frequency band (step S510). The initial value of the estimated gain may be the target gain. Assuming that a vector of the estimated gain is $\overline{g}^P = [g_0^P \ g_1^P \ \ldots \ g_N^P]$, the initial value thereof may be set as follows:

$$\overline{g}^P = \overline{g}^T \quad (6).$$

Then, the equalization gain determining module 53 calculates a reference gain of the $n^{th}$ frequency band, and determines an extension gain according to the reference gain and the estimated gain (step S530). In an embodiment, the equalization gain determining module 53 determines a corresponding new estimated gain starting from the lowest frequency band (e.g., the aforementioned $0^{th}$ frequency band) in the frequency bands (to the $1^{st}$ frequency band, the $2^{nd}$ frequency band, . . . , the $N^{th}$ frequency band). Assuming that a vector of the reference gain is $\overline{g}^r = [g_0^r \ g_1^r \ \ldots \ g_N^r]$, a relation between the reference gain and the target gain is as follows (with n=0 as an example):

$$g_0^T = \left\| \overline{c}_0 \cdot \begin{bmatrix} g_0^r \\ g_1^P \\ \vdots \\ g_N^P \end{bmatrix} \right\|. \quad (7)$$

The equalization gain determining module 53 may obtain the reference gain $g_0^r$ of the $0^{th}$ frequency band according to the formula (7), and then determine at least one extension gain according to the reference gain $g_n^r$ of the frequency band and the corresponding estimated gain $g_n^P$ (n=0 in the first calculation). The extension gain is, for example, at least one value between the reference gain $g_n^r$ and the corresponding estimated gain $g_n^P$, $$\frac{g_n^P \cdot g_n^P}{g_n^r},$$

or a value obtained from other mathematical relations based on the reference gain $g_n^r$ and the corresponding estimated gain $g_n^P$, and a user may self-change as required.

Then, the equalization gain determining module 53 determines a new estimated gain of the frequency band according to the reference gain of the frequency band and the corresponding estimated gain (step S550). The gain error between the new estimated gain of the currently evaluated frequency band, after being inputted into the filtering processing (i.e., the amplitude obtained after being multiplied by the frequency response matrix $\overline{C}$), and the corresponding target gain is the least. In an embodiment, the processing device 50 inputs each extension gain obtained in the foregoing into the filtering processing to judge the gain error between the extension gain and the corresponding target gain, and uses the least gain error as a new estimated gain $g_n^{PP}$ (n=0 in the first calculation).

After the new estimated gain of the $0^{th}$ frequency band is obtained, the processing device 50 may calculate estimated gains of other frequency bands. The equalization gain determining module 53 may use a new estimated gain of the previous frequency band (e.g., the $0^{th}$ frequency band) as an estimated gain initial value $g_n^P = g_n^{PP}$ of the next frequency band (e.g., the $1^{st}$ frequency band), and the process returns to steps S530 and S550 to calculate new estimated gains $\overline{g}^{PP}$ of other frequency bands, and ends until a preset condition is satisfied. It is to be noted that the relation between the reference gain for the $1^{st}$ frequency band and the target gain is as follows (with n=1 as an example):

$$g_1^T = \left\| \overline{c}_1 \cdot \begin{bmatrix} g_0^{PP} \\ g_1^r \\ \vdots \\ g_N^P \end{bmatrix} \right\|, \quad (8)$$

and the process proceeds to the $N^{th}$ frequency band from the formulas (7) and (8) by analogy.

In an embodiment, the preset condition is related to that the equalization gain determining module 53 only determines the corresponding new estimated gains of frequency bands, which are less than a low frequency threshold (e.g., 1 kHz, 3 kHz or 5 kHz), in the frequency bands. In other words, the aforementioned steps S510 to S550 are only targeted to the frequency bands less than the low frequency threshold, and only obtain new estimated gains of the 5 frequency bands.

In another embodiment, the preset condition is related to that the equalization gain determining module 53 stops after determining the corresponding new estimated gains of all of the frequency bands once (i.e., performing only one loop). In still another embodiment, the equalization gain determining module 53 determines, in response to obtaining of the new estimated gains of all of the frequency bands within the first loop, second new estimated gains (i.e., a second loop is performed) according to the new estimated gains of the frequency bands, where the gain error between the second new estimated gain of each of the frequency bands, after being inputted into the filtering processing (i.e., multiplied by the frequency response matrix $\overline{C}$), and the corresponding target gain is the least. It is to be noted that the embodiments of the disclosure do not limit the number of loops, and the user may self-adjust the number.

Then, the equalization gain determining module 53 uses the new estimated gain (if one loop is performed) or the second new estimated gain (if two loops are performed) of the frequency bands as the equalization gain. That is:

$$\overline{g}^{EQ} = \overline{g}^{PP} \tag{9}$$

Returning to FIG. 4, compared with input of the target gain in the prior art, after the equalization gain is obtained by the embodiments of the disclosure, the filtering processing module 54 inputs the equalization gains into the filtering processing (or into the corresponding filters) according to the corresponding frequency bands (step S450) to approach the target gain. Here, the input refers to further multiplying a frequency signal on each frequency band distinguished by the filtering processing by the corresponding equalization gain to obtain the amplitude approaching the target gain.

Figure 6:
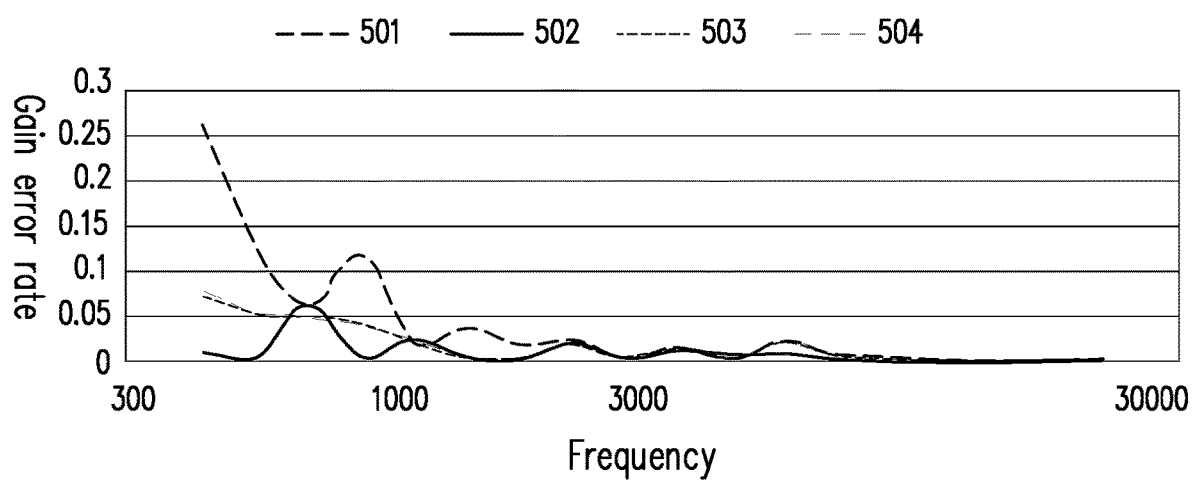
FIG. 6 is a corresponding diagram of a frequency and a gain error.

FIG. 6 is a corresponding diagram of a frequency and a gain error. Referring to FIG. 6, the gain error is $$\left| \frac{g_n^T}{\overline{c}_n \cdot \overline{g}^{EQ}} - 1 \right|$$

for example. In general, the gain error of a high frequency portion (e.g., more than 3 kHz or 5 kHz) is less, but the gain error of a low frequency portion (e.g., less than 1 kHz or 500 Hz) is larger. Again error 501 in the prior art is as high as 0.26 in the low frequency portion. If the equalization gain of the embodiments of the disclosure is introduced only for signals below 1 kHz (i.e., the low frequency threshold is 1 kHz), a gain error 504 of the low frequency portion may fall below 0.1, but the high frequency portion is similar to the gain error 501 in the prior art. If only one loop is processed, a gain error 502 thereof may fall again in the high frequency portion. If two loops are processed, a gain error 503 may be lower. It can be seen that the adjusting method according to the embodiment of the disclosure can improve a gain error and make a signal closer to a target value regardless of a high frequency or low frequency portion.

Based on the above, the adjusting system and the adjusting method for equalization processing according to the embodiments of the disclosure measure an energy state of a center frequency of each frequency band, define a target gain suitable for each frequency band according to the charac-teristics of a sound field, and adjust corresponding equalization gains, respectively, so that the amplitude obtained after multiplying the equalization gain by a frequency response of a filter may approach the target gain (i.e., the gain error is minimized). Accordingly, the impact of the filtering processing on a low frequency portion may be reduced.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. An adjusting system for equalization processing, corresponding target gains of a sound signal in a plurality of frequency bands being determined after the sound signal is subjected to a filtering processing, the adjusting system comprising:
   a processor, configured to load instructions stored in a memory of the adjusting system, and when the instructions are executed, the processor functions as:
      a target gain determining module, which obtains a plurality of frequency band energies of a plurality of sound receiving signals, and determines a plurality of target gains corresponding to the plurality of frequency bands according to the plurality of frequency band energies, wherein the plurality of frequency band energies corresponds to the plurality of different frequency bands, respectively;
      a frequency response determining module, which obtains frequency responses of the filtering processing with respect to a plurality of center frequencies;
      an equalization gain determining module, which determines a plurality of equalization gains corresponding to the plurality of frequency bands and having a gain error with a minimized error value, wherein the gain error is related to a difference between an amplitude obtained after the plurality of equalization gains is reflected on the plurality of frequency responses corresponding to the filtering processing and the plurality of target gains; and
      a filtering processing module, which inputs the plurality of equalization gains into the filtering processing according to the corresponding frequency bands,
      wherein during a process of determining the plurality of equalization gains, the equalization gain determining module determines an initial value of an estimated gain corresponding to one of the frequency bands, calculates a reference gain of the frequency band, and determines a new estimated gain of the frequency band according to the reference gain of the frequency band and the corresponding estimated gain,
      wherein the gain error between the new estimated gain of each of the frequency bands, after being inputted into the filtering processing, and the corresponding target gain is the least.

2. The adjusting system for equalization processing according to claim 1, further comprising:
   a loudspeaker device, which plays a plurality of training sound signals respectively, wherein a center frequency corresponding to each of the training sound signals is different from center frequencies of the plurality of other training sound signals, and the center frequencies corresponding to the plurality of training sound signals correspond to the plurality of different frequency bands, respectively; and a sound receiving device, which receives a sound in response to playing of each of the training sound signals to obtain the plurality of sound receiving signals.

3. The adjusting system for equalization processing according to claim 2, wherein the equalization gain determining module uses the new estimated gain of a first frequency band as the initial value of the estimated gain of a second frequency band.

4. The adjusting system for equalization processing according to claim 2, wherein the equalization gain determining module determines at least one extension gain according to the reference gain of the frequency band and the corresponding estimated gain, and inputs each of the extension gains into the filtering processing to determine the gain error between the extension gain and the corresponding target gain.

5. The adjusting system for equalization processing according to claim 4, wherein one of the extension gains is a value obtained from a mathematical relation based on the reference gain and the corresponding estimated gain.

6. The adjusting system for equalization processing according to claim 2, wherein the equalization gain determining module determines the corresponding new estimated gain starting from the lowest frequency band of the plurality of frequency bands.

7. The adjusting system for equalization processing according to claim 2, wherein the equalization gain determining module determines, in response to obtaining of the new estimated gains of all of the plurality of frequency bands, second new estimated gains according to the new estimated gains of the plurality of frequency bands, and uses the second new estimated gains of the plurality of frequency bands as the plurality of equalization gains, wherein the gain error between the second new estimated gain of each of the frequency bands, after being inputted into the filtering processing, and the corresponding target gain is the least.

8. The adjusting system for equalization processing according to claim 2, wherein the equalization gain determining module only determines the corresponding new estimated gains of a portion of the frequency bands, which are less than a low frequency threshold, in the plurality of frequency bands.

9. An adjusting method for equalization processing, corresponding target gains of a sound signal in a plurality of frequency bands being determined after the sound signal is subjected to a filtering processing, the adjusting method comprising:

obtaining a plurality of frequency band energies of a plurality of sound receiving signals, wherein the plurality of frequency band energies corresponds to a plurality of different frequency bands, respectively;

determining a plurality of target gains corresponding to the plurality of frequency bands according to the plurality of frequency band energies;

obtaining frequency responses of the filtering processing with respect to a plurality of center frequencies;

determining a plurality of equalization gains corresponding to the plurality of frequency bands and having a gain error with a minimized error value, wherein the gain error is related to a difference between an amplitude obtained after the plurality of equalization gains is reflected on the plurality of frequency responses corresponding to the filtering processing and the plurality of target gains; and inputting the plurality of equalization gains into the filtering processing according to the corresponding frequency bands, wherein determining the plurality of equalization gains corresponding to the plurality of frequency bands and having the gain error with the minimized error value comprises:

determining an initial value of an estimated gain corresponding to one of the frequency bands;

calculating a reference gain of the frequency band; and determining a new estimated gain of the frequency band according to the reference gain of the frequency band and the corresponding estimated gain, wherein the gain error between the new estimated gain of each of the frequency bands, after being inputted into the filtering processing, and the corresponding target gain is the least.

10. The adjusting method for equalization processing according to claim 9, further comprising:

playing a plurality of training sound signals respectively and receiving a sound to generate the plurality of sound receiving signals, wherein center frequencies corresponding to the plurality of training sound signals correspond to the plurality of different frequency bands, respectively.

11. The adjusting method for equalization processing according to claim 9, wherein the step of determining the initial value of the estimated gain corresponding to one of the frequency bands comprises:

using the new estimated gain of a first frequency band as the initial value of the estimated gain of a second frequency band.

12. The adjusting method for equalization processing according to claim 9, wherein determining the new estimated gain of the frequency band according to the reference gain of the frequency band and the corresponding estimated gain comprises:

determining at least one extension gain according to the reference gain of the frequency band and the corresponding estimated gain; and inputting each of the extension gains into the filtering processing to determine the gain error between the extension gain and the corresponding target gain.

13. The adjusting method for equalization processing according to claim 9, further comprising:

determining the corresponding new estimated gain starting from the lowest frequency band of the plurality of frequency bands.

14. The adjusting method for equalization processing according to claim 9, wherein after determining the new estimated gain of the frequency band according to the reference gain of the frequency band and the corresponding estimated gain, the method further comprises:

determining, in response to obtaining of the new estimated gains of all of the plurality of frequency bands, second new estimated gains according to the new estimated gains of the plurality of frequency bands; and using the second new estimated gains of the plurality of frequency bands as the plurality of equalization gains, wherein the gain error between the second new estimated gain of each of the frequency bands, after being inputted into the filtering processing, and the corresponding target gain is the least.

15. The adjusting method for equalization processing according to claim 9, further comprising:

only determining the corresponding new estimated gains of a portion of the frequency bands, which are less than a low frequency threshold, in the plurality of frequency bands.

* * * * *